United States Patent
Castaneda et al.

(10) Patent No.: US 10,923,160 B2
(45) Date of Patent: Feb. 16, 2021

(54) TESTING ASSEMBLY FOR SEALED HARD DISK DRIVES

(71) Applicant: Seagate Technology LLC, Cupertino, CA (US)

(72) Inventors: Noel Castaneda, Denver, CO (US); Jerome F. Griep, Longmont, CO (US); Jeffrey Benjamin Tattershall, Milliken, CO (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/503,845

(22) Filed: Jul. 5, 2019

(65) Prior Publication Data
US 2021/0005226 A1 Jan. 7, 2021

(51) Int. Cl.
| | | |
|---|---|---|
| G11B 33/14 | (2006.01) | |
| G06F 3/06 | (2006.01) | |
| G11B 19/04 | (2006.01) | |
| G11B 20/18 | (2006.01) | |
| G11B 33/12 | (2006.01) | |
| G01R 33/12 | (2006.01) | |
| G11B 5/012 | (2006.01) | |

(52) U.S. Cl.
CPC ........ *G11B 33/1446* (2013.01); *G06F 3/0619* (2013.01); *G06F 3/0653* (2013.01); *G06F 3/0676* (2013.01); *G11B 19/041* (2013.01); *G11B 20/182* (2013.01); *G11B 33/121* (2013.01); *G11B 33/144* (2013.01); *G11B 33/1473* (2013.01); *G01R 33/1207* (2013.01); *G11B 5/012* (2013.01); *G11B 33/1486* (2013.01)

(58) Field of Classification Search
None
See application file for complete search history.

(56) References Cited

U.S. PATENT DOCUMENTS

| | | | |
|---|---|---|---|
| 5,600,511 A * | 2/1997 | Dunfield | G11B 25/043 360/98.07 |
| 5,646,334 A | 7/1997 | Scheppers et al. | |
| 6,214,070 B1 * | 4/2001 | Crowder | B01D 46/10 360/99.22 |
| 6,324,923 B1 | 12/2001 | Dinsmore | |
| 6,395,073 B1 * | 5/2002 | Dauber | B01D 39/1692 360/99.17 |
| 6,466,392 B1 * | 10/2002 | Fioravanti | G11B 5/40 360/75 |
| 7,064,920 B2 * | 6/2006 | Fujiwara | G11B 25/043 360/97.18 |
| 7,306,659 B2 * | 12/2007 | Gorton | B01D 46/0032 360/97.17 |
| 7,569,088 B2 * | 8/2009 | Strom | G11B 33/142 360/97.16 |
| 8,773,812 B1 * | 7/2014 | Gustafson | G11B 33/1446 360/97.22 |
| 2002/0066808 A1 * | 6/2002 | Fiala | B05B 15/18 239/700 |

(Continued)

Primary Examiner — Jefferson A Evans
(74) Attorney, Agent, or Firm — Faegre Drinker Biddle & Reath LLP

(57) ABSTRACT

A hard disk drive includes a base deck, a cover coupled to the base deck to create an internal cavity, and a testing assembly coupled to the cover. The testing assembly includes a housing and is arranged to expose an organic material, for example grease or oil, to the internal cavity.

18 Claims, 7 Drawing Sheets

(56) References Cited

U.S. PATENT DOCUMENTS

| | | | |
|---|---|---|---|
| 2003/0021054 A1* | 1/2003 | Feliss | G11B 33/148 360/69 |
| 2006/0155074 A1* | 7/2006 | Kudo | C09K 3/10 525/329.7 |
| 2007/0157588 A1* | 7/2007 | Dauber | B01D 46/103 55/385.6 |
| 2008/0088301 A1* | 4/2008 | Tan | G01R 31/2874 324/750.06 |
| 2018/0160730 A1* | 6/2018 | Bless | G01J 5/0014 |

* cited by examiner

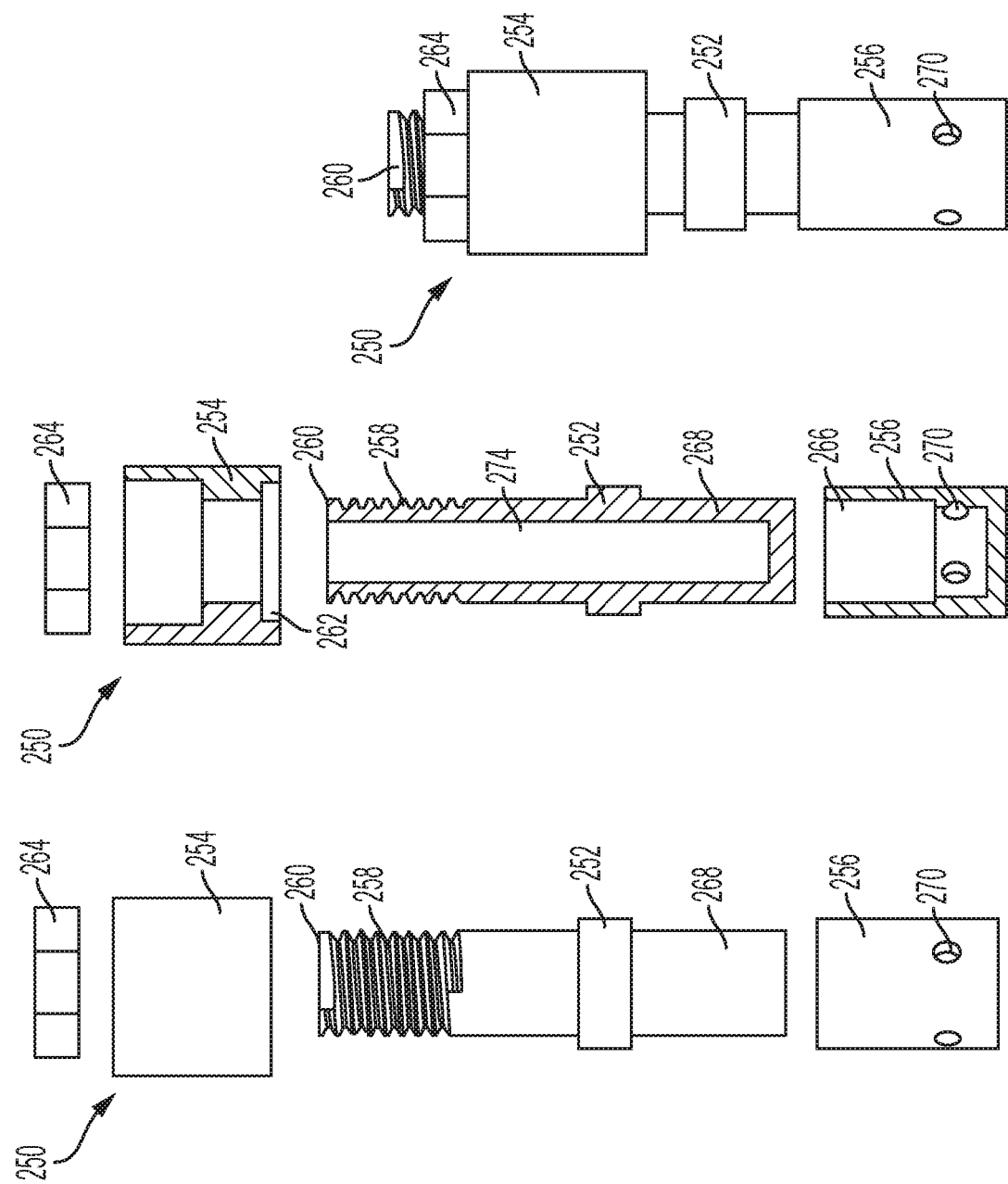

TESTING ASSEMBLY FOR SEALED HARD DISK DRIVES

SUMMARY

In certain embodiments, a hard disk drive includes a base deck, a cover coupled to the base deck to create an internal cavity, and a testing assembly coupled to the cover and arranged to expose an organic material to the internal cavity.

In certain embodiments, a method for testing a hard disk drive is disclosed. The hard disk drive includes an internal cavity and is coupled to a testing assembly. The method includes positioning an organic material in the testing assembly and heating the organic material by applying heat to the testing assembly to facilitate migration of the organic material within the internal cavity.

In certain embodiments, a hard disk drive includes a base deck, a cover coupled to the base deck to create an internal cavity, and means for exposing an organic material to the internal cavity.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

BRIEF DESCRIPTION OF THE DRAWINGS

FIG. 4 shows an exploded view of components of a testing assembly, in accordance with certain embodiments of the present disclosure.

FIG. 5 shows an exploded cut-away side view of the testing assembly of FIG. 4, in accordance with certain embodiments of the present disclosure.

FIG. 6 shows a side view of the testing assembly of FIGS. 4 and 5, in accordance with certain embodiments of the present disclosure.

Figure 1:
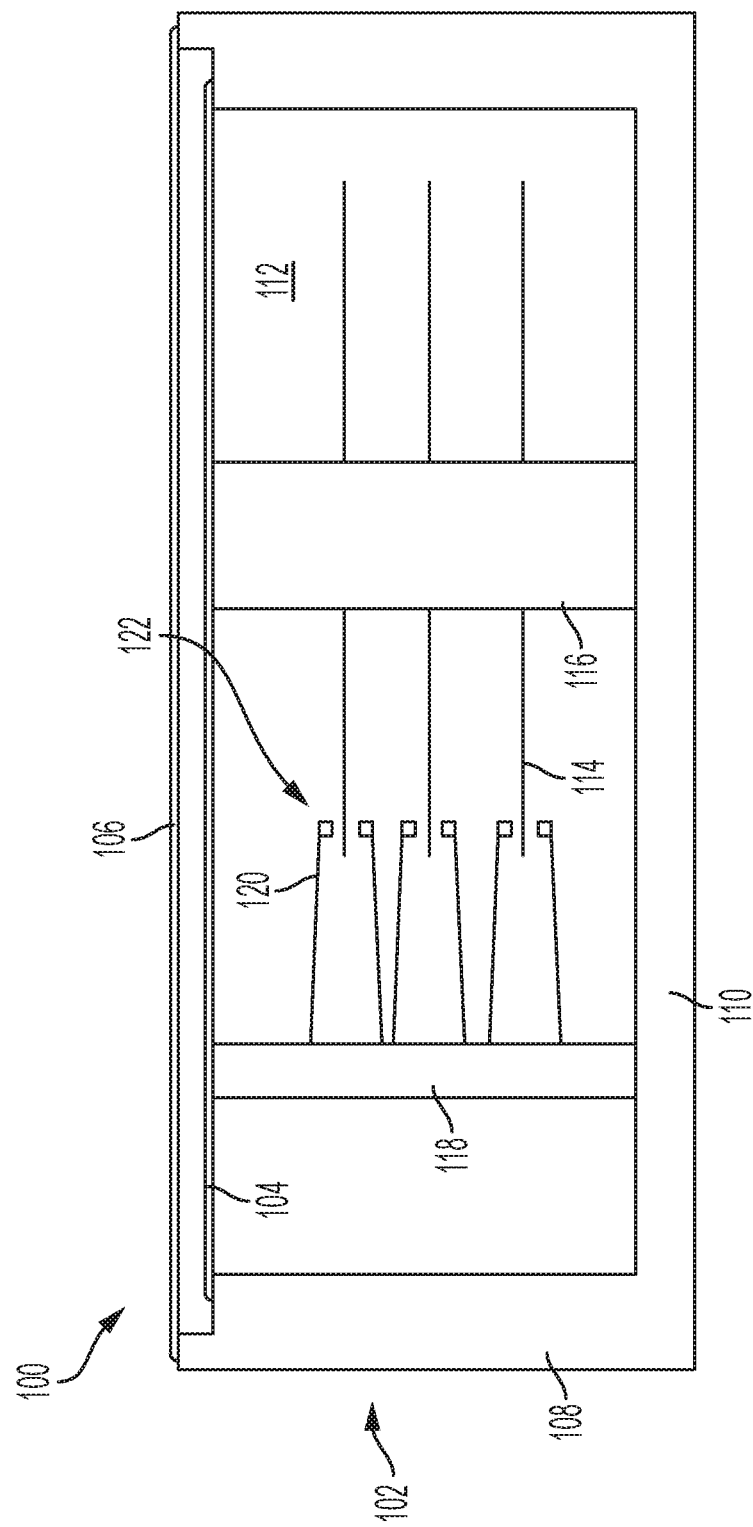
FIG. 1 shows a cut-away side view schematic of a hard disk drive, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope of the appended claims.

DETAILED DESCRIPTION

Hard disk drives typically include a housing that forms an internal cavity in which various components are positioned. Some components such as spindle motors and actuator pivot bearings include greases or oils that comprise organic materials. Under certain conditions, the organic materials will outgas (e.g., migrate out of the components) into various areas of the internal cavity. If the organic materials deposit on magnetic recording media and/or read/write heads, the organic materials can cause errors and/or failures. For example, the organic materials may interfere with a hard disk drive's ability to read data from the magnetic recording media or write data to the magnetic recording media.

The internal cavity of hard disk drives is typically filled with air. But sealing and filling the internal cavity with gases other than air can enhance performance of hard disk drives. For example, low-density inert gases such as helium can reduce the aerodynamic drag between magnetic recording media and read/write heads compared to operating in air. This reduced aerodynamic drag results in reduced power usage for the spindle motor. A helium-filled hard disk drive thus uses less power than a comparable hard disk drive that operates in an air environment. However, when the internal cavity is filled with low-density gases like helium, certain organic materials may be more likely to migrate from the components (e.g., spindle motors, pivot bearings) compared to in an air environment. Further, hard disk drives that operate with a lower internal pressure than air-filled hard disk drives may be more susceptible to outgassing. Predicting or otherwise analyzing the conditions and extent of outgassing can be time consuming.

Certain embodiments of the present disclosure include testing assemblies and methods that can be used in connection with, or incorporated into, hard disk drives to analyze outgassing of organic materials in a hard disk drive filled with a low-density gas like helium.

FIG. 1 shows a cut away side view of a hard disk drive 100 including a base deck 102, a process cover 104, and a final cover 106. The base deck 102 includes side walls (e.g., side wall 108) that, together with a bottom portion 110 of the base deck 102 and the process cover 104, creates an internal cavity 112 that may house data storage components like magnetic recording media 114, a spindle motor 116, an actuator pivot bearing 118, suspensions 120, and read/write heads 122. The spindle motor 116 and the actuator pivot bearing 118 are shown in FIG. 1 as being coupled between the process cover 104 and the bottom portion 110 of the base deck 102.

During assembly, the process cover 104 can be coupled to the base deck 102 by removable fasteners (not shown) and a gasket (e.g., form-in-place gasket) to seal a target gas (e.g., air with nitrogen and oxygen and/or a lower-density gas like helium) within the internal cavity 112. Once the process cover 104 is coupled to the base deck 102, a target gas may be injected into the internal cavity 112 through an aperture in the process cover 104, which is subsequently sealed. Injecting the target gas, such as a combination of air and a low-density gas like helium (e.g., 90 percent or greater helium), may involve first evacuating existing gas from the internal cavity 112 using a vacuum and then injecting the target gas from a low-density gas supply reservoir into the internal cavity 112. The aperture in the process cover 104 can be sealed via an adhesive, weld, or the like to keep the target gas within the hard disk drive 100 and, in particular, the internal cavity 112. Once the process cover 104 is sealed, the hard disk drive 100 can be subjected to a variety of processes and tests. After the hard disk drive 100 is processed and passes certain tests, the internal cavity 112 may be refilled with the target gas and then resealed. Finally, the final cover 106 can be coupled to the base deck 102 via welding.

Figure 2:
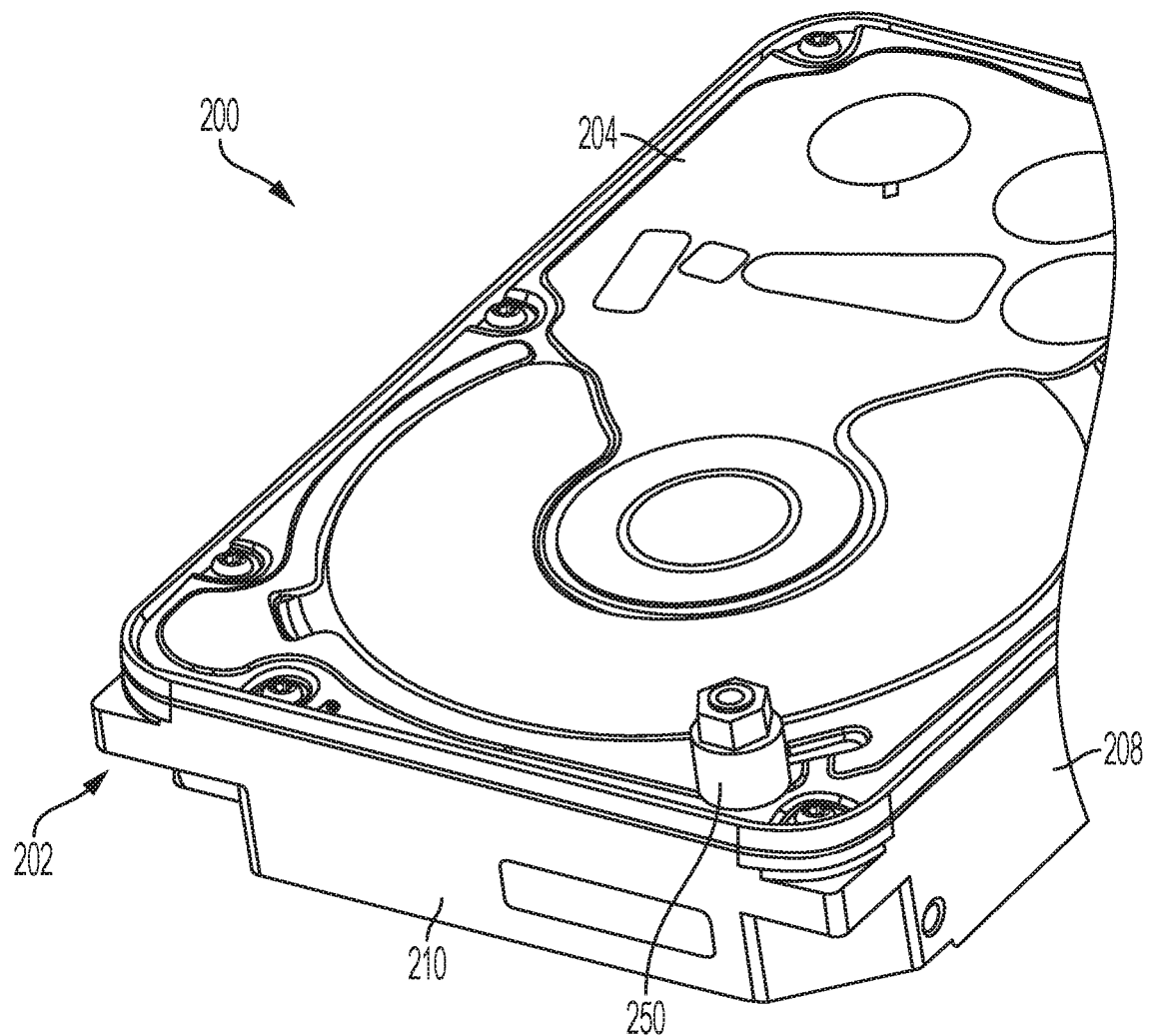
FIG. 2 shows a partial perspective view of a hard disk drive, in accordance with certain embodiments of the present disclosure.
Figure 3:
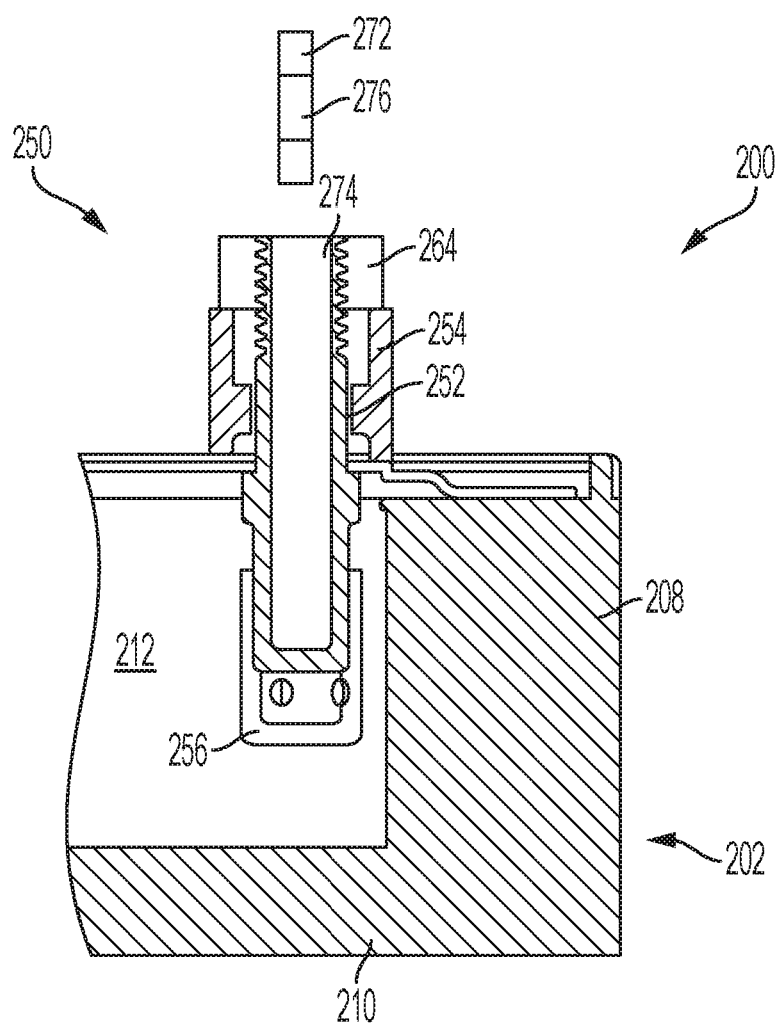
FIG. 3 shows a cut-away side view of a portion of the hard disk drive of FIG. 2, in accordance with certain embodiments of the present disclosure.

FIGS. 2 and 3 show a hard disk drive 200 with a testing assembly 250, and FIGS. 4-6 show various views of the testing assembly 250. The hard disk drive 200 includes a base deck 202 that is coupled to a cover 204 (e.g., a process cover) and includes side walls (e.g., side wall 208) that, together with a bottom portion 210 of the base deck 202 and the cover 204, creates an internal cavity 212 (shown in FIG. 3) that may house data storage components like magnetic recording media, etc. The internal cavity 212 can be sealed and house a target gas (e.g., a gas comprising helium).

As shown in FIGS. 2 and 3, the testing assembly 250 is coupled to the cover 204. The testing assembly 250 extends partially into the internal cavity 212 and partially external to the hard disk drive 200. As best seen in FIGS. 4-6, the testing assembly 250 includes a housing 252, a collar 254, and a capsule 256. To assemble the testing assembly 250 and couple the testing assembly 250 to the cover 204, the capsule 256 is coupled to the housing 252, for example, by a friction fit. The housing 252 is then inserted through a cutout in the cover 204. The housing 252 includes a threaded portion 258 at its distal end 260. The collar 254 is slid over the distal end 260, and an adhesive is applied between the collar 254 (e.g., within recess 262, as shown in FIG. 5) and the cover 204 to help prevent gas leaking from the internal cavity 212. A coupler 264 (e.g., a nut such as a hex nut) is coupled to the housing 252 to tighten the collar 254 against the cover 204 and compress the adhesive.

As shown in FIG. 5, in certain embodiments, the capsule 256 is a cylindrical-shaped cap with an internal opening 266 shaped to fit over a proximal end 268 of the housing 252 and secure to the proximal end 268 via a friction fit. The capsule 256 includes one or more outlets 270. FIGS. 4-6 show the capsule 256 as including four separate outlets 270, although fewer or more outlets 270 can be used.

The testing assembly 250 can be used to analyze outgassing of organic materials in the hard disk drive 200, which may be filled with the target gas. As alluded to above, organic materials are more likely to outgas under certain environmental conditions such as when hard disk drives operate at high temperatures, which the testing assembly 250 is configured to replicate or otherwise model.

A predetermined amount of an organic material such as grease or oil can be placed into the capsule 256. The outlets 270 expose the organic material to the internal cavity 212. The testing assembly 250 can then be heated such that the organic material is heated. As shown in FIG. 3, in certain embodiments, a heater 272 such as a cylindrical cartridge heater is inserted into a lumen 274 in the testing assembly 250 and activated to heat the testing assembly 250 (and therefore the organic material). In certain embodiments, the heater 272 includes a built-in temperature sensor 276 (e.g., a thermocouple), as shown in FIG. 3, which measures the temperature of the heater 272. Additionally or alternatively, a temperature sensor can be positioned within the internal cavity 212 of the hard disk drive 200.

The testing assembly 250 can comprise a material such as aluminum with thermal conductivity properties that effectively transfer heat from the heater 272 to the capsule 256 and the organic material. As the organic material is heated and the hard disk drive 200 is operated, the organic material escapes the capsule 256 through the outlets 270. In certain embodiments, the testing assembly 250 is positioned within the hard disk drive 200 such that the outlets 270 are positioned in an area with higher air flow compared to other areas within the hard disk drive 200. As shown in FIG. 2, the testing assembly 250 is positioned in a corner of the hard disk drive 200 between the side wall 208 and outer edges of the magnetic recording media. The air flow can encourage the organic material to migrate from the capsule 256 via the outlets 270 to other areas of the internal cavity 212. Additionally or alternatively, the testing assembly 250 is positioned at an area of low pressure such that the organic material is more easily drawn out of the outlets 270 of the capsule 256. The corner of the hard disk drive 200 where the testing assembly 250 is positioned in FIG. 2 is one example of a low-pressure area within the internal cavity 212. In certain embodiments, the testing assembly 250 is positioned away from gaskets such that the heat generated by the heater 272 does not affect the gaskets.

Using the testing assembly 250 shown in FIGS. 2-6, outgassing of organic materials within hard disk drives can be analyzed without requiring additional or expensive equipment such as chambers, additional sensors, and the like. Instead, the testing assembly 250 can be coupled to a commercially-produced hard disk drive with minimal customization, e.g., modifying a cover to include an additional cutout for the testing assembly 250.

Figure 7:
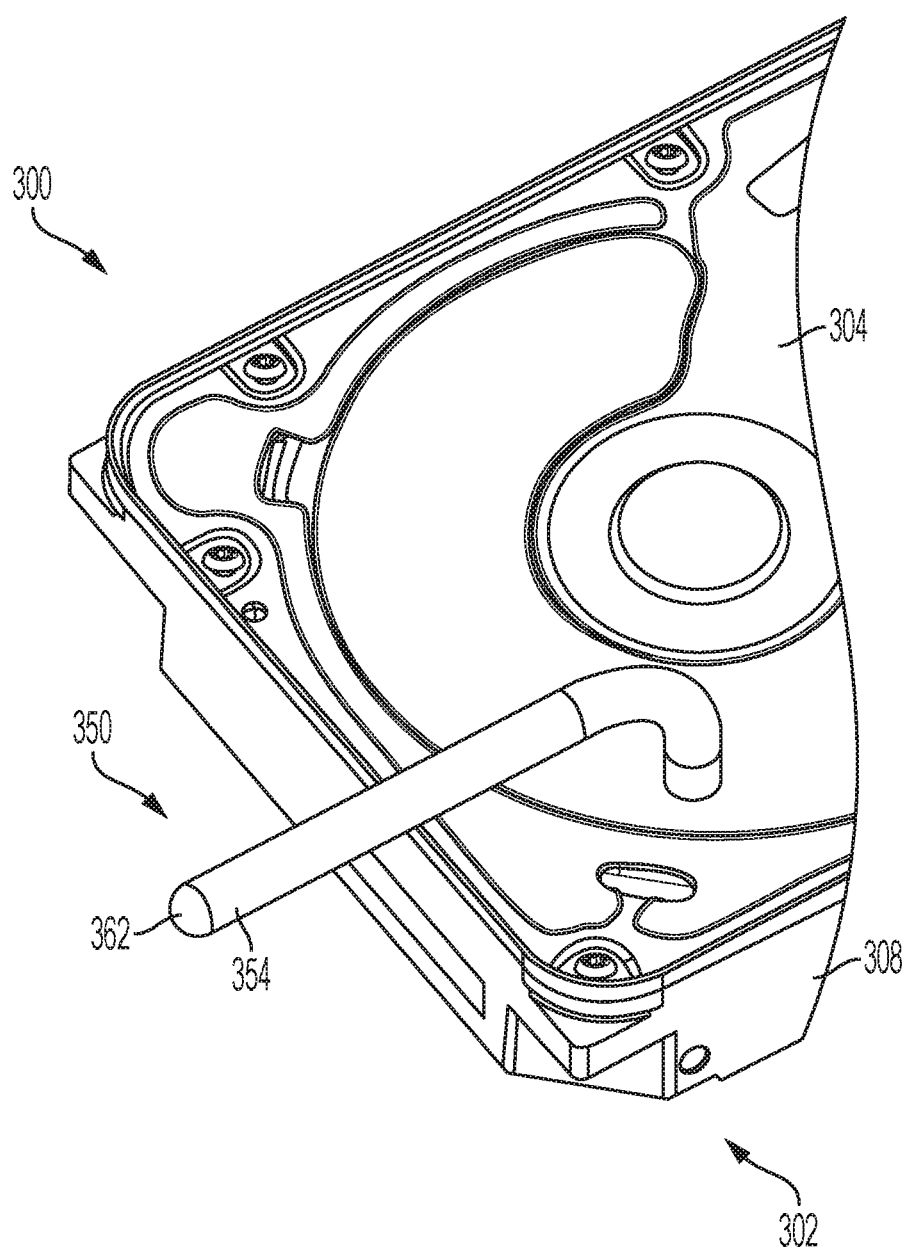
FIG. 7 shows a partial perspective view of a hard disk drive, in accordance with certain embodiments of the present disclosure.
Figure 8:
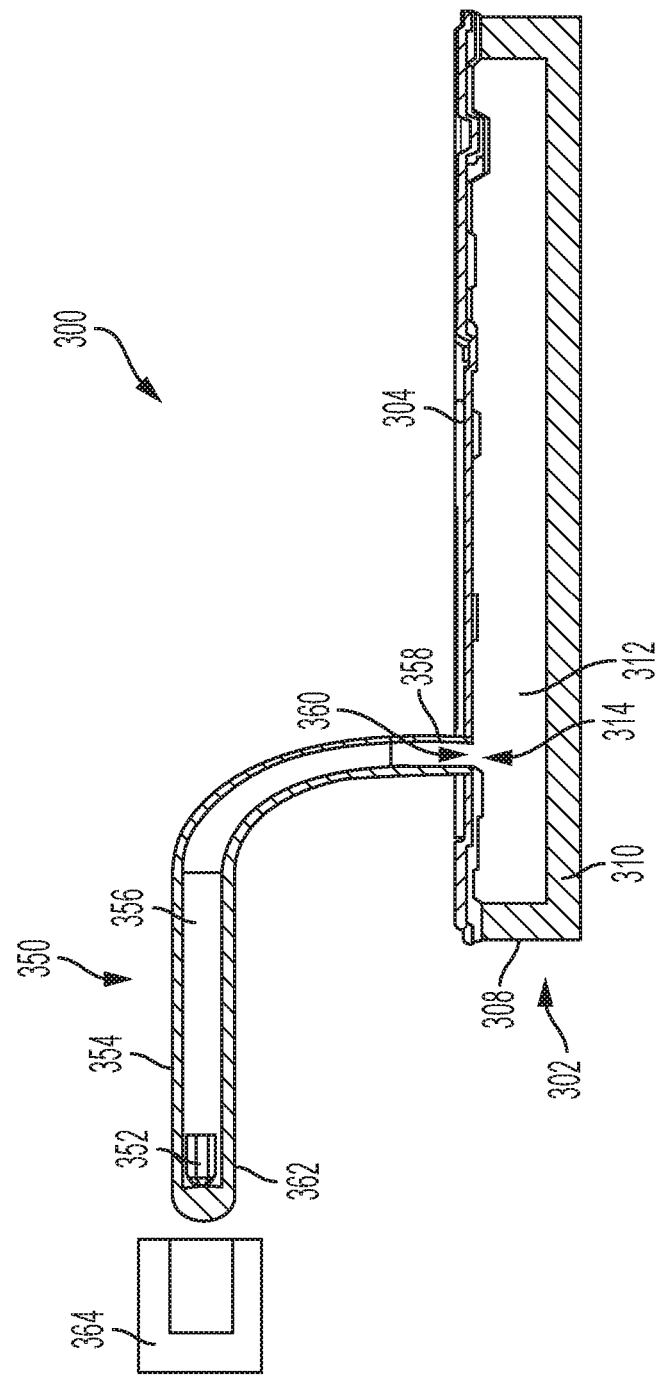
FIG. 8 shows a cut-away side view of a portion of the hard disk drive of FIG. 7, in accordance with certain embodiments of the present disclosure.

FIG. 7 shows a hard disk drive 300 with a testing assembly 350, and FIG. 8 shows a cut-away view of the testing assembly 350. The hard disk drive 300 includes a base deck 302 that is coupled to a cover 304 (e.g., a process cover) and includes side walls (e.g., side wall 308) that, together with a bottom portion 310 of the base deck 302 and the cover 304, creates an internal cavity 312 that may house data storage components like magnetic recording media, etc. The internal cavity 312 can be sealed and house a target gas (e.g., a gas comprising helium). The cover 304 includes an opening 314 that is covered by the testing assembly 350 when the testing assembly 350 is coupled to the cover 304.

The testing assembly 350 is coupled to the cover 304 and includes a capsule 352 (shown in FIG. 8) and a tube 354. The capsule 352 can be a cylindrical-shaped cap-like structure and can comprise a magnetic material (e.g., a magnetic steel). The capsule 352 is shaped to fit into a lumen 356 of the tube 354. The tube 354 can be generally L-shaped and comprise a material such as steel (e.g., stainless steel). The tube 354 is coupled to the cover 304 at a proximal end 358 by, for example, welding the tube 354 to the cover 304 such that gas is prevented from leaking from the internal cavity 312 other than into the lumen 356 of the tube 354. The proximal end 358 of the tube 354 includes an opening 360 that opens into the opening 314 of the cover 304.

The testing assembly 350 can be used to analyze outgassing of organic materials in the hard disk drive 300, which may be filled with the target gas. A predetermined amount of an organic material such as grease or oil can be placed into the capsule 352. For example, the capsule 352 can include a bore in which the organic material is placed. The organic material held in the capsule 352 is exposed to the internal cavity 312.

The capsule 352 can then be placed into the lumen 356 of the tube 354 such that the capsule 352 is positioned at a distal end 362 of the tube 354. The cover 304 can then be coupled to the base deck 302 and the internal cavity 312 filled with the target gas. During this process and testing of the hard disk drive 300, the capsule 352 can be kept at its position at the distal end 362 by a magnet that attracts the magnetic capsule 352. For example, a magnet can be placed externally at the distal end 362 of the tube 354 to secure the capsule 352 within the tube 354.

After the internal cavity 312 is filled with the desired amount of the target gas, the testing assembly 350 can then be heated such that the organic material is heated. In certain embodiments, a heater 364 (shown in FIG. 8) such as a cylindrical pencil heater is inserted over the external surface of the tube 354 and activated to heat the testing assembly 350 (and therefore the organic material). For example, the heater 364 can include a sleeve that at least partially covers the tube 354 and transmits heat to the testing assembly 350. In certain embodiments, the heater 364 includes a built-in temperature sensor (e.g., a thermocouple), which measures the temperature of the heater 364. Additionally or alternatively, a temperature sensor can be positioned within the internal cavity 312 of the hard disk drive 300. Heating the organic material encourages the material to outgas a vapor, which exits the capsule 352 and the tube 354 into the internal cavity 312 of the hard disk drive 300 by diffusion.

Using the testing assembly 350 shown in FIGS. 7 and 8, outgassing of organic materials within hard disk drives can be analyzed without requiring additional or expensive equipment such as chambers, additional sensors, and the like. Instead, the testing assembly 350 can be coupled to a commercially-produced hard disk drive with minimal customization, e.g., modifying a cover to include an additional cutout for the testing assembly 350.

Figure 9:
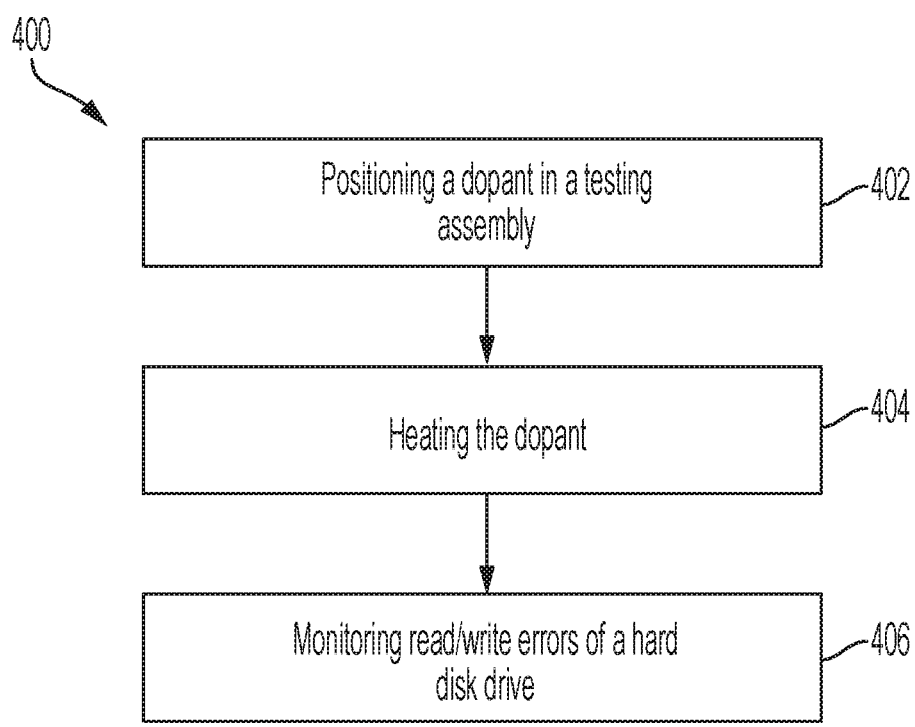
FIG. 9 shows a block diagram representing steps of a method, in accordance with certain embodiments of the present disclosure.

Both the testing assembly 250 of FIGS. 2-6 and the testing assembly 350 of FIGS. 7 and 8 can be used to carry out various testing processes. FIG. 9 outlines a method 400 that can be used with either testing assembly. The method 400 includes positioning an organic material in the testing assembly (block 402 in FIG. 9). For example, the organic material can be placed in a dopant capsule. The method 400 also includes heating the organic material by applying heat to the testing assembly to facilitate migration of the organic material within the internal cavity (block 404 in FIG. 9). In certain embodiments, the organic material is heated by using a heater such as a cylindrical cartridge heater or a pencil heater to heat the test assembly. The heater can selectively increase the amount of heat it generates to increase the temperature of the organic material. As the temperature increases or as the temperature is held at a given temperature over time, the method 400 includes monitoring read/write errors of a hard disk drive (block 406 in FIG. 9). For example, the hard disk drive can be operated and programmed to carry out a testing routine that involves writing and reading data at various locations on the magnetic recording media to determine whether the organic material has migrated to the magnetic recording media. Monitoring for read/write errors can indicate whether certain temperatures are more likely to cause a given organic material to migrate. As such, different organic material can be analyzed and their performance compared to each other to determine which organic material are more or less likely to migrate within the hard disk drive. Further, different hard disk drive component designs can be analyzed to determine whether certain designs are more or less likely to encourage migration of organic material within the hard disk drive.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A hard disk drive comprising:
a base deck;
a cover coupled to the base deck to create an internal cavity; and
a testing assembly coupled to the cover and arranged to expose an organic material to the internal cavity, the testing assembly including a housing that comprises aluminum, is partially positioned outside the internal cavity, and partially extends into the internal cavity.

2. The hard disk drive of claim 1, wherein the testing assembly is arranged to hold the organic material within the internal cavity.

3. The hard disk drive of claim 1, wherein the testing assembly is arranged to hold the organic material outside the internal cavity.

4. The hard disk drive of claim 1, wherein the testing assembly includes a plurality of outlets to expose the organic material to the internal cavity.

5. The hard disk drive of claim 1, wherein the testing assembly includes a capsule having an opening and that is configured to hold the organic material.

6. The hard disk drive of claim 5, wherein the capsule is positioned within the internal cavity.

7. The hard disk drive of claim 5, wherein the capsule is positioned outside the internal cavity.

8. The hard disk drive of claim 1, wherein the testing assembly comprises a magnetic material.

9. The hard disk drive of claim 1, wherein the housing comprises a thermally-conductive material.

10. The hard disk drive of claim 1, wherein the testing assembly is positioned at one of the four corners of the hard disk drive.

11. A method for testing a hard disk drive, which includes an internal cavity and is coupled to a testing assembly, the method comprising:
positioning a grease or oil in the testing assembly; and
heating the grease or oil by applying heat to the testing assembly to facilitate migration of the grease or oil within the internal cavity.

12. The method of claim 11, wherein heating the grease or oil includes selectively increasing the applied heat to increase temperature of the grease or oil.

13. The method of claim 11, further comprising:
operating the hard disk drive; and
monitoring read/write errors of the hard disk drive as the grease or oil is heated.

14. The method of claim 13, wherein operating the hard disk drive includes carrying out a testing routine involving writing data to a magnetic recording medium and reading data from the magnetic recording medium.

15. The method of claim 11, wherein heating the grease or oil includes contacting the testing assembly with a heater and generating heat by the heater.

16. The method of claim 11, further comprising:
exposing the grease or oil to the internal cavity.

17. The method of claim 11, wherein positioning the grease or oil in the testing assembly includes placing the grease or oil in a capsule.

18. A hard disk drive comprising:
a base deck;
a cover coupled to the base deck to create an internal cavity; and
means for exposing a grease or oil to the internal cavity.

* * * * *